United States Patent
Yu et al.

(10) Patent No.: US 6,778,401 B1
(45) Date of Patent: Aug. 17, 2004

(54) MINI-TYPE CONNECTOR OF CIRCUIT SUBSTRATE

(75) Inventors: Gordon Yu, Taipei (TW); Forli Wen, Hsinchu (TW); Justin Cheng, Taichung (TW)

(73) Assignees: C-One Technology Corp., Hsin-Chu (TW); Pretec Electronics Corp., Fremont, CA (US)

( * ) Notice: Subject to any disclaimer, the term of this patent is extended or adjusted under 35 U.S.C. 154(b) by 2 days.

(21) Appl. No.: 10/437,029

(22) Filed: May 14, 2003

(30) Foreign Application Priority Data

Jan. 24, 2003 (TW) ........................ 92201381 U

(51) Int. Cl.[7] .................. H05K 1/18; H05K 7/02; H01R 12/00

(52) U.S. Cl. ............... 361/752; 361/736; 439/55; 439/76.1

(58) Field of Search ................. 361/752, 737, 361/730, 729, 728, 736; 439/55, 59, 65, 96.1, 83, 78

(56) References Cited

U.S. PATENT DOCUMENTS

| | | | | |
|---|---|---|---|---|
| 5,920,459 A | * | 7/1999 | Weber et al. | 361/752 |
| 6,086,430 A | * | 7/2000 | Amoni et al. | 439/680 |
| 6,297,448 B1 | * | 10/2001 | Hara | 174/52.3 |
| 6,307,538 B1 | * | 10/2001 | Bacon | 345/163 |
| 6,334,793 B1 | * | 1/2002 | Amoni et al. | 439/680 |
| 6,422,469 B1 | * | 7/2002 | Pernet | 235/486 |
| 6,456,500 B1 | * | 9/2002 | Chen | 361/752 |
| 6,490,163 B1 | * | 12/2002 | Pua et al. | 361/737 |
| 6,500,018 B1 | * | 12/2002 | Pfaffenberger et al. | 439/325 |
| 6,671,808 B1 | * | 12/2003 | Abbott et al. | 713/200 |

* cited by examiner

Primary Examiner—David Martin
Assistant Examiner—Dameon E. Levi
(74) Attorney, Agent, or Firm—Bacon & Thomas, PLLC

(57) ABSTRACT

A mini-type connector has a substrate, a plurality of metal joints and a metal frame. The substrate includes a connector and a circuit board, wherein the connector is extended from the circuit board. The plurality of metal joints is assembled to the connector of the substrate for being electrically connected to an external electronic device. The metal frame covers the connector of the substrate for enhancing the stress-resistance strength of the connector. The connector is integrally formed with the circuit board.

5 Claims, 3 Drawing Sheets

MINI-TYPE CONNECTOR OF CIRCUIT SUBSTRATE

BACKGROUND OF THE INVENTION

1. Field of the Invention

The present invention relates to connectors of circuit substrate, and particularly to a mini-type connector of a circuit substrate which will cause the product arranged with the connector to have a smaller thickness. The mini-type connector can be applied to memory cards, adaptor cards, card readers, laser indicators or wireless modules such as GPS (Global Position System) modules, and bluetooth modules or GPRS (General Packet Radio Service) modules.

2. Description of Related Art

In the current information technology industry, portable electronic devices are becoming more and more popular. Other than providing fundamental functions, these devices can be connected to hosts (for example, personal computers or notebook computers) for data transmission or other functions via the same transmission interface. In general, in these products, the substrate of the circuit board is separated from the connectors of the transmission interface.

Referring to FIG. 1a, a prior art flash disk is illustrated, wherein the connector 11 is separated from the printed circuit board (PCB) 12. The connector 11 is assembled to the PCB 12 through the welding points 1211, and 1212. Referring to FIG. 1b, a lateral view shows the combination of the connector 11 and the PCB 12. The upper and lower surfaces of the PCB 12 are assembled with a plurality of electronic components 122. A bottom of the connector 11 is flush with the bottom of the PCB 12. Since the connector 11 is assembled to the PCB 12 through the welding points 1212, 1213, the welding points 1212, 1213 will make the device thicker. Especially, the welding points 1213 of the bottom of the PCB 12 protrude from the bottom of the connector 11. This protrusion will result in that the housing 13 must enclose the electronic components 122 and welding points 1212, 1213 of the upper and lower surfaces. As a result, the products are excessively thick and can not achieve the object of compactness.

SUMMARY OF THE INVENTION

Accordingly, the primary object of the present invention is to provide a mini-type connector of a circuit substrate, wherein the product has a compact size and the cost can be low.

Another object of the present invention is to provide a mini-type connector of a circuit substrate, wherein the lifetime is long and the strength of the connector is good.

To achieve above objects, the present invention provides a mini-type connector which comprises a substrate including a circuit board and a connector extended from the circuit board; a plurality of metal joints assembled to the connector of the substrate for being electrically connected to an external electronic device; and a metal frame covering the connector of the substrate for enhancing the stress strength of the connector. The connector is integrally formed with the circuit board.

The various objects and advantages of the present invention will be more readily understood from the following detailed description when read in conjunction with the appended drawings.

DETAILED DESCRIPTION OF THE PREFERRED EMBODIMENT

Figure 1A:
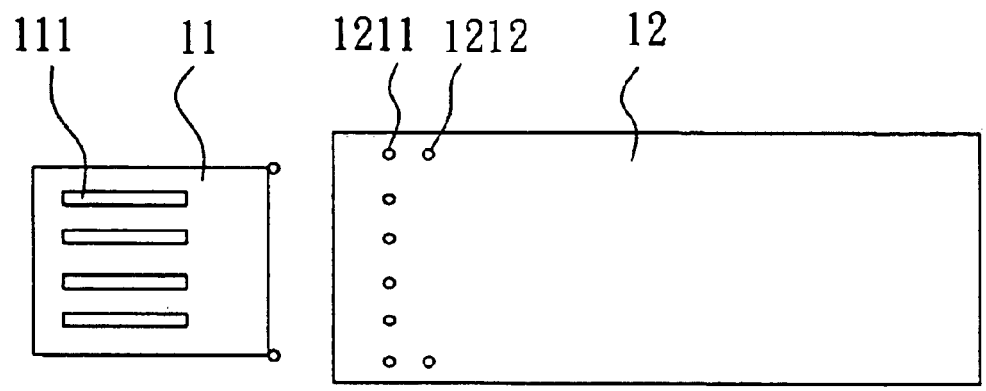
FIG. 1a is a schematic view that includes the prior art connector and substrate of a circuit board.
Figure 1B:
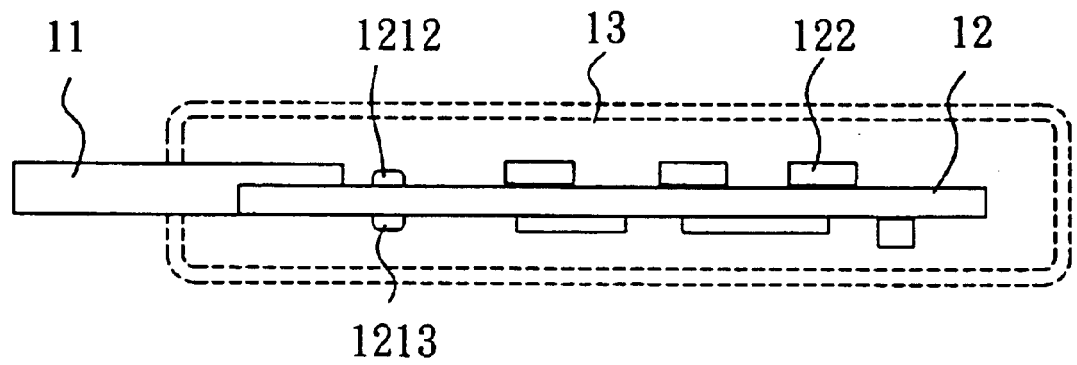
FIG. 1b is a schematic view showing the whole structure of the product.
Figure 2:
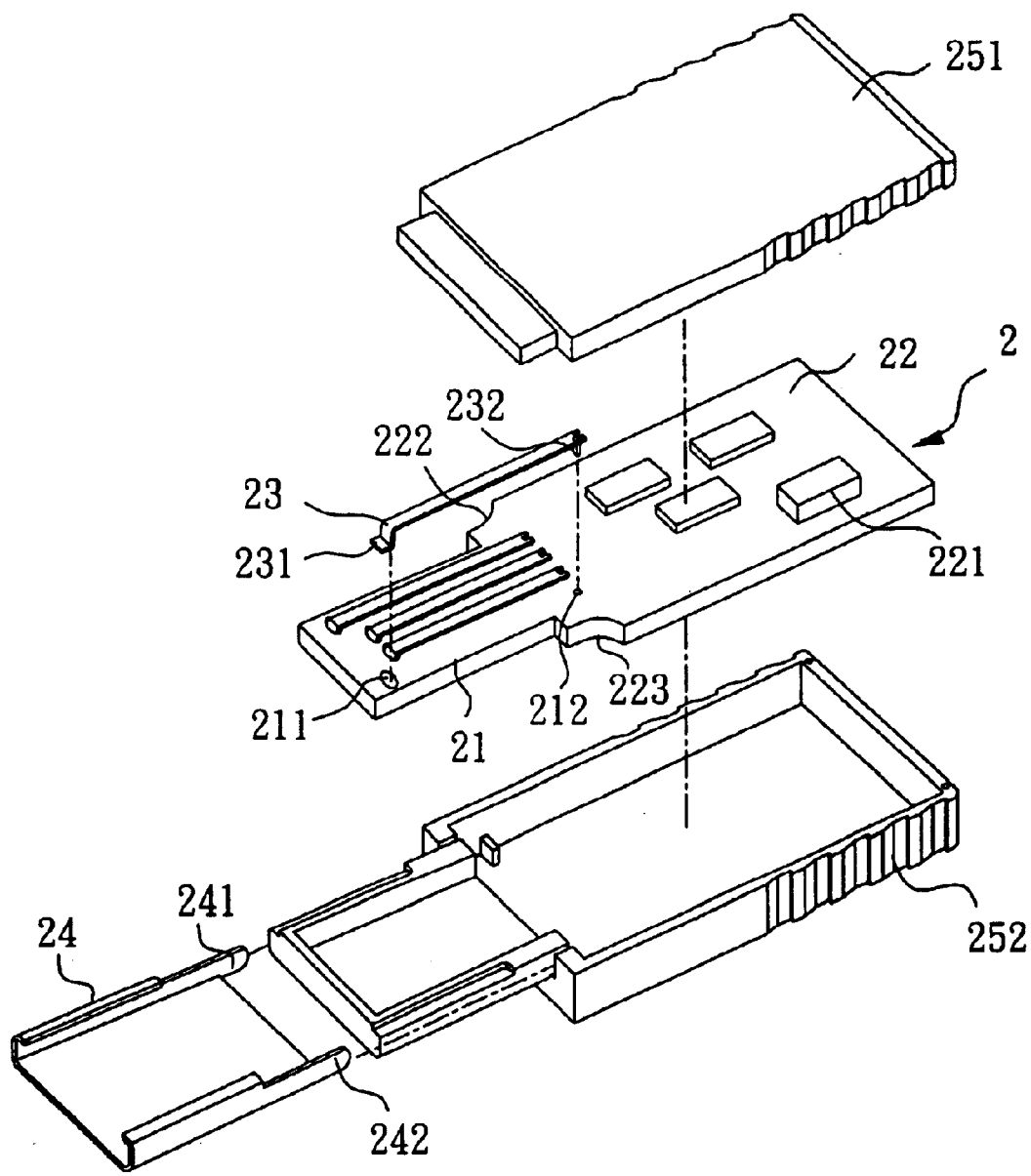
FIG. 2 is an exploded perspective view of a preferred embodiment of the present invention.

The mini-type connector of a circuit substrate of the present invention will be described herein with reference to the exploded perspective view of FIG. 2. The mini-type connector includes a substrate 2, a metal frame 24, and housings 251, 252. The substrate 2 includes a circuit board 22, and a connector 21 extended from the circuit board 22. The circuit board 22 and the connector 21 are integrally formed with the substrate 2. In this embodiment, the substrate 2 is a printed circuit board (PCB).

The connector 21 of the substrate 2 is formed with a plurality of metal joints 23. The shapes of the metal joints 23 are based on the electronic device 3 to be inserted thereinto, for example a long strip metal joint. The two terminals 231, 232 of each metal joint 23 are hooks. The connector 21 of the substrate 2 has a plurality of connecting holes 211, 212. Thereby, the terminals 231, 232 of each metal joint 23 can be inserted into the connecting holes 211, 212, so that the metal joint 23 can be installed thereon. Then, the metal joint 23 is welded to the substrate 2. Thereby, the device of this embodiment can be connected to an external device by the plurality of metal joints 23. The mini-type connector may be pulled out and inserted into the electronic device 3 many times without failure as the metal joints 23 provide a contact superior in life span compared to the prior art connectors.

The connector 21 of the substrate 2 is extended from the circuit board 22, and the connector 21 must bear an external force and provide a shield of the metal joint 23. Therefore, a U-shaped metal frame 24 covers the connector 21. An upper half of the metal frame 24 has a notch. Thereby, after the metal frame 24 surrounding the connector 21, the metal joints 23 can expose out. One side of the lower half of the metal frame 24 has two pins 241, 242 extending therefrom. The two pins 241, 242 can be inserted and welded to the two corresponding cutouts 222, 223 of the circuit board 22 for fixing the metal frame 24 and the stress of the connector 21 can be minimized. The cutouts 222, 223 are connected to the ground of the substrate 2 and thus it can provide an optimum ground effect.

Figure 3:
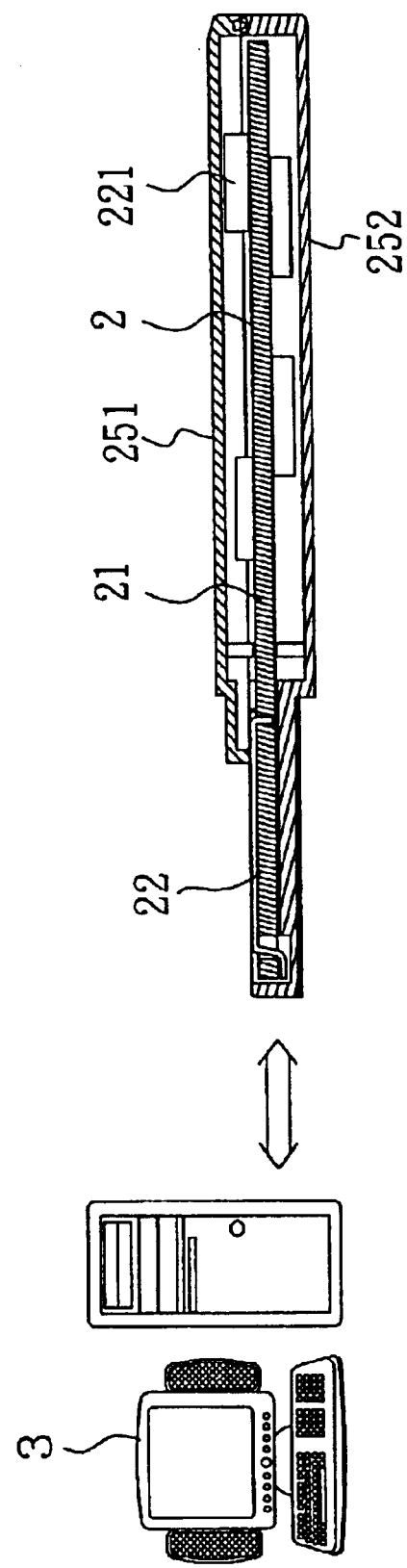
FIG. 3 is a cross section view of the preferred embodiment of the present invention.

Referring to FIG. 3, a schematic view of the mini-type connector of the present invention is shown. The circuit board 22 of the substrate 2 is installed with at least one electronic element 221. The arrangement of the electronic element 221 may be on the upper surface, lower surface or both of the two surfaces based on the requirement of the substrate 2. The at least one electronic element 221 includes a flash memory and other related IC chips. A part of the connector 21, the circuit board 22, the metal frame 24 and the metal joints 23 are enclosed by the housings 251 and 252. The electronic element 221 can be for example a computer.

The connector 21 is extended from the circuit board 22, i.e., the connector 21 and the circuit board 22 are at the same printed circuit board. After the metal frame 24 covers the connector 21, the circuit board 22 is embedded in the metal frame 24. The upper and lower surfaces of the circuit board 22 are retained with an elevation difference with the upper and lower surfaces of the metal frame 24. This elevation difference exactly receives the electronic components 221 at the upper and lower surfaces of the circuit board 22 and the welding points by which the pins 241, 242 are welded to the circuit board 22. Thus, the entire thickness of the product is smaller than the prior art and so a device fitted with the invention can be accordingly thinner than previous products.

Thereby, it is appreciated that in the present invention, the connector and the circuit board are integrally formed. The joints of the connector are metal pieces, and metal frame is used to enclose the connector and the substrate so as to minimize the stress incurred. Thereby, the product is compact and the cost can be lowered relative to the prior art. The product lifetime is long and the connector is strong with an optimum ground effect.

The present invention is thus described, though it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A mini-type connector, comprising:

a substrate including a circuit board, a ground, and a connector extended from the circuit board wherein the circuit board has a plurality of cutouts and the connector has a plurality of connecting holes;

a plurality metal joints assembled to the connector of the substrate for being electrically connected to an external electronic device, wherein the metal joints are assembled to the substrate through the connecting holes; and a metal frame covering the connector of the substrate and exposing the metal joints, and having a plurality of extending pins welded to the ground of the substrate at the cutouts for securing the metal frame.

2. The mini-type connector as claimed in claim 1, further comprising an external housing enclosing the substrate, the metal joints and the metal frame for providing a protection thereto.

3. The mini-type connector as claimed in claim 1, wherein the metal joints are each a long strip and have at least one hooked terminal for connection with the connecting holes.

4. The mini-type connector as claimed in claim 1, wherein the metal frame has a U-shape for exposing the metal joints.

5. The mini-type connector as claimed in claim 1, wherein the metal joints are welded to the connector of the substrate.

* * * * *